United States Patent
Lin

(10) Patent No.: US 6,403,460 B1
(45) Date of Patent: *Jun. 11, 2002

(54) METHOD OF MAKING A SEMICONDUCTOR CHIP ASSEMBLY

(76) Inventor: Charles W. C. Lin, 34 Pinewood Grove, Singapore (SG), 738290

( * ) Notice: Subject to any disclaimer, the term of this patent is extended or adjusted under 35 U.S.C. 154(b) by 0 days.

This patent is subject to a terminal disclaimer.

(21) Appl. No.: 09/878,522

(22) Filed: Jun. 11, 2001

Related U.S. Application Data

(63) Continuation-in-part of application No. 09/643,445, filed on Aug. 22, 2000.

(51) Int. Cl.[7] .......................... H01L 21/44; H01L 21/48; H01L 21/50; H01L 21/4763; H01L 23/48; H01L 23/52; H01L 29/40

(52) U.S. Cl. ...................... 438/618; 438/108; 438/622; 438/637; 438/666; 257/693; 257/778

(58) Field of Search ................................. 438/108, 618, 438/622, 637, 666; 257/693, 778

(56) References Cited

U.S. PATENT DOCUMENTS

| | | | |
|---|---|---|---|
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 5,074,947 A | 12/1991 | Estes et al. | 156/307.3 |
| 5,106,461 A | 4/1992 | Volfson et al. | 205/125 |
| 5,116,463 A | 5/1992 | Lin et al. | 156/653 |
| 5,137,845 A | 8/1992 | Lochon et al. | 437/183 |
| 5,167,992 A | 12/1992 | Lin et al. | 427/437 |
| 5,196,371 A | 3/1993 | Kulesza et al. | 437/183 |
| 5,209,817 A | 5/1993 | Ahmad et al. | 156/643 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |

(List continued on next page.)

FOREIGN PATENT DOCUMENTS

| | | | |
|---|---|---|---|
| EP | 0 718 882 A1 | 6/1996 | ......... H01L/23/057 |
| WO | WO 97/38563 | 10/1997 | ............ H05K/1/03 |
| WO | WO 99/57762 | 11/1999 | ........... H01L/23/48 |

OTHER PUBLICATIONS

Markstein et al., "Controlling the Variables in Stencil Printing," Electronic Packaging & Production, Feb. 1997, pp. 48–56.

Elenius, "Choosing a Flip Chip Bumping Supplier—Technology an IC Package contractor should look for," Advanced Packaging, Mar./Apr. 1998, pp. 70–73.

Erickson, "Wafer Bumping: The Missing Link for DCA," Electronic Packaging & Production, Jul. 1998, pp. 43–46.

(List continued on next page.)

Primary Examiner—Tuan H. Nguyen
Assistant Examiner—Noma Berezny
(74) Attorney, Agent, or Firm—David M. Sigmond

(57) ABSTRACT

A method of manufacturing a semiconductor chip assembly includes providing a semiconductor chip that includes a conductive pad, and providing a support circuit that includes an insulative base and a conductive trace. One embodiment includes mechanically attaching the chip to the support circuit using an adhesive such that a portion of the pad is directly beneath the conductive trace, and then applying an etch to form openings in the base and the adhesive such that the opening in the base exposes the conductive trace and the openings expose the pad. Another embodiment includes disposing an adhesive beneath the support circuit, applying an etch to form openings in the base and the adhesive, and then mechanically attaching the chip to the support circuit using the adhesive such that the opening in the base exposes the conductive trace and the openings expose the pad. Preferably, a connection joint is formed inside the openings that contacts and electrically connects the conductive trace and the pad.

120 Claims, 9 Drawing Sheets

U.S. PATENT DOCUMENTS

| | | | | |
|---|---|---|---|---|
| 5,275,330 | A | 1/1994 | Issacs et al. | 228/180.2 |
| 5,284,796 | A | 2/1994 | Nakanishi et al. | 437/183 |
| 5,293,067 | A | 3/1994 | Thompson et al. | 257/668 |
| 5,327,010 | A | 7/1994 | Uenaka et al. | 257/679 |
| 5,334,804 | A | 8/1994 | Love et al. | 174/267 |
| 5,346,750 | A | 9/1994 | Hatakeyama et al. | 428/209 |
| 5,355,283 | A | 10/1994 | Marrs et al. | 361/760 |
| 5,358,621 | A | 10/1994 | Oyama | 205/123 |
| 5,397,921 | A | 3/1995 | Karnezos | 257/779 |
| 5,407,864 | A | 4/1995 | Kim | 437/203 |
| 5,424,245 | A | 6/1995 | Gurtler et al. | 437/183 |
| 5,438,477 | A | 8/1995 | Pasch | 361/689 |
| 5,439,162 | A | 8/1995 | George et al. | 228/180.22 |
| 5,447,871 | A * | 9/1995 | Goldstein | 437/14 |
| 5,447,886 | A | 9/1995 | Rai | 437/183 |
| 5,454,161 | A | 10/1995 | Beilin et al. | 29/852 |
| 5,454,928 | A | 10/1995 | Rogers et al. | 205/125 |
| 5,475,236 | A | 12/1995 | Yoshizaki | 257/48 |
| 5,477,933 | A | 12/1995 | Nguyen | 174/262 |
| 5,478,007 | A | 12/1995 | Marrs | 228/180.22 |
| 5,483,421 | A | 1/1996 | Gedney et al. | 361/771 |
| 5,484,647 | A | 1/1996 | Nakatani et al. | 428/209 |
| 5,487,218 | A | 1/1996 | Bhatt et al. | 29/852 |
| 5,489,804 | A | 2/1996 | Pasch | 257/778 |
| 5,493,096 | A | 2/1996 | Koh | 219/121.91 |
| 5,508,229 | A | 4/1996 | Baker | 437/183 |
| 5,525,065 | A | 6/1996 | Sobhani | 439/67 |
| 5,536,973 | A | 7/1996 | Yamaji | 257/737 |
| 5,542,601 | A | 8/1996 | Fallon et al. | 228/119 |
| 5,547,740 | A | 8/1996 | Higdon et al. | 428/209 |
| 5,556,810 | A | 9/1996 | Fujitsu | 437/209 |
| 5,556,814 | A | 9/1996 | Inoue et al. | 437/250 |
| 5,564,181 | A | 10/1996 | Dineen et al. | 29/841 |
| 5,572,069 | A | 11/1996 | Schneider | 257/690 |
| 5,576,052 | A | 11/1996 | Arledge et al. | 427/98 |
| 5,583,073 | A | 12/1996 | Lin et al. | 439/183 |
| 5,595,943 | A | 1/1997 | Itabashi et al. | 437/230 |
| 5,599,744 | A | 2/1997 | Koh et al. | 437/195 |
| 5,611,140 | A | 3/1997 | Kulesza et al. | 29/832 |
| 5,611,884 | A | 3/1997 | Bearinger et al. | 156/325 |
| 5,613,296 | A | 3/1997 | Kurino et al. | 29/852 |
| 5,614,114 | A | 3/1997 | Owen | 219/121.66 |
| 5,615,477 | A | 4/1997 | Sweitzer | 29/840 |
| 5,619,791 | A | 4/1997 | Lambrecht, Jr. et al. | 29/852 |
| 5,627,405 | A | 5/1997 | Chillara | 257/668 |
| 5,627,406 | A | 5/1997 | Pace | 257/700 |
| 5,633,204 | A | 5/1997 | Tago et al. | 438/614 |
| 5,637,920 | A | 6/1997 | Loo | 257/700 |
| 5,641,113 | A | 6/1997 | Somaki et al. | 228/180.22 |
| 5,645,628 | A | 7/1997 | Endo et al. | 106/1.23 |
| 5,646,067 | A | 7/1997 | Gaul | 437/180 |
| 5,648,686 | A | 7/1997 | Hirano et al. | 257/778 |
| 5,654,584 | A | 8/1997 | Fujitsu | 257/666 |
| 5,656,858 | A | 8/1997 | Kondo et al. | 257/737 |
| 5,663,598 | A | 9/1997 | Lake et al. | 257/737 |
| 5,665,652 | A | 9/1997 | Shimizu | 438/127 |
| 5,666,008 | A | 9/1997 | Tomita et al. | 257/778 |
| 5,669,545 | A | 9/1997 | Pham et al. | 228/1.1 |
| 5,674,785 | A | 10/1997 | Akram et al. | 437/217 |
| 5,674,787 | A | 10/1997 | Zhao et al. | 437/230 |
| 5,682,061 | A | 10/1997 | Khandros et al. | 257/666 |
| 5,691,041 | A | 11/1997 | Frankeny et al. | 428/209 |
| 5,722,162 | A | 3/1998 | Chou et al. | 29/852 |
| 5,723,369 | A | 3/1998 | Barber | 438/106 |
| 5,731,223 | A | 3/1998 | Padmanabhan | 437/183 |
| 5,736,456 | A | 4/1998 | Akram | 438/614 |
| 5,739,585 | A | 4/1998 | Akram et al. | 257/698 |
| 5,744,859 | A | 4/1998 | Ouchida | 257/668 |
| 5,757,071 | A | 5/1998 | Bhansali | 257/697 |
| 5,757,081 | A | 5/1998 | Chang et al. | 257/778 |
| 5,764,486 | A | 6/1998 | Pendse | 361/774 |
| 5,774,340 | A | 6/1998 | Chang et al. | 361/771 |
| 5,789,271 | A | 8/1998 | Akram | 438/18 |
| 5,798,285 | A | 8/1998 | Bentlage et al. | 438/108 |
| 5,801,072 | A | 9/1998 | Barber | 438/107 |
| 5,801,447 | A | 9/1998 | Hirano et al. | 257/778 |
| 5,803,340 | A | 9/1998 | Yeh et al. | 228/56.3 |
| 5,804,771 | A | 9/1998 | McMahon et al. | 174/255 |
| 5,808,360 | A | 9/1998 | Akram | 257/738 |
| 5,811,879 | A | 9/1998 | Akram | 257/723 |
| 5,817,541 | A | 10/1998 | Averkiou et al. | 438/107 |
| 5,822,856 | A | 10/1998 | Bhatt et al. | 29/832 |
| 5,834,844 | A | 11/1998 | Akagawa et al. | 257/734 |
| 5,861,666 | A | 1/1999 | Bellaar | 257/686 |
| 5,863,816 | A | 1/1999 | Cho | 438/123 |
| 5,870,289 | A | 2/1999 | Tokuda et al. | 361/779 |
| 5,883,435 | A | 3/1999 | Geffken et al. | 257/758 |
| 5,905,303 | A * | 5/1999 | Kata et al. | 257/701 |
| 5,925,931 | A | 7/1999 | Yamamoto | 257/737 |
| 5,994,222 | A | 11/1999 | Smith et al. | 438/689 |
| 6,012,224 | A | 1/2000 | DiStefano et al. | 29/840 |
| 6,013,877 | A | 1/2000 | Degani et al. | 174/264 |
| 6,018,196 | A | 1/2000 | Noddin | 257/777 |
| 6,020,561 | A | 2/2000 | Ishida et al. | 174/261 |
| 6,037,665 | A | 3/2000 | Miyazaki | 257/773 |
| 6,046,909 | A | 4/2000 | Joy | 361/748 |
| 6,084,297 | A | 6/2000 | Brooks et al. | 257/698 |
| 6,084,781 | A | 7/2000 | Klein | 361/771 |
| 6,103,552 | A | 8/2000 | Lin | 438/113 |
| 6,103,992 | A | 8/2000 | Noddin | 219/121.71 |
| 6,127,204 | A | 10/2000 | Isaacs et al. | 438/106 |
| 6,306,680 | B1 * | 10/2001 | Fillion et al. | 438/106 |
| 6,287,893 | B1 * | 11/2001 | Elenius et al. | 438/108 |

OTHER PUBLICATIONS

Kuchenmeister et al., "Film Chip Interconnection Systems Prepared By Wet Chemical Metallization," IEEE publication 0–7803–4526–6/98, Jun. 1998, 5 pages.

Ghaffarian, "Long Time BGA Assembly Reliability," Advancing Microelectronics, vol. 25, No. 6, Sep./Oct. 1998, pp. 20–23.

U.S. application No. 09/465,024, filed Dec. 16, 1999, entitled "Bumpless Flip Chip Assembly With Solder Via".

U.S. application No. 09/464,562, filed Dec. 16, 1999, entitled "Bumpless Flip Chip Assembly With Strips And Via–Fill".

U.S. application No. 09/464,561, filed Dec. 16, 1999, entitled "Bumpless Flip Chip Assembly With Strips–In–Via And Plating".

U.S. application No. 09/120,408, filed Jul. 22, 1998, entitled "Flip Chip Assembly With Via Interconnection".

U.S. application No. 09/643,212, filed Aug. 22, 2000, entitled "Semiconductor Chip Assembly With Simultaneously Electroplated Contact Terminal and Connection Joint".

U.S. application No. 09/643,214, filed Aug. 22, 2000, entitled "Semiconductor Chip Assembly with Simultaneously Electrolessly Plated Contact Terminal and Connection Joint".

U.S. application No. 09/643,213, filed Aug. 22, 2000, entitled "Method Of Making A Support Circuit For A Semiconductor Chip Assembly".

U.S. application No. 09/865,367, filed May 24, 2001, entitled "Semiconductor Chip Assembly With Simultaneously Electroplated Contact Terminal and Connection Joint".

U.S. application No. 09/864,555, filed May 24, 2001, entitled "Semiconductor Chip Assembly with Simultaneously Electrolessly Plated Contact Terminal and Connection Joint".

U.S. application No. 09/864,773, filed May 24, 2001, entitled "Semiconductor Chip Assembly With Ball Bond Connection Joint".

* cited by examiner

METHOD OF MAKING A SEMICONDUCTOR CHIP ASSEMBLY

CROSS-REFERENCE TO RELATED APPLICATIONS

This application is a continuation-in-part of U.S. application Ser. No. 09/643,445 filed Aug. 22, 2000, which is incorporated by reference.

BACKGROUND OF THE INVENTION

1. Field of the Invention

The present invention relates generally to a semiconductor chip assembly, and more particularly to a semiconductor chip assembly in which a semiconductor chip is mechanically and electrically connected to a support circuit.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding. Wire bonding is by far the most common. In this approach, wires are bonded, one at a time, from the chip to external circuitry by ultrasonic, thermocompression or thermosonic processes. TAB involves bonding gold-bumped pads on the chip to external circuitry on a polymer tape using thermocompression bonding. Both wire bonding and TAB require mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip chip technology has tremendous advantages over wire bonding and TAB, its cost and technical limitations are significant. For instance, the cost of forming bumps on the pads is significant. In addition, an adhesive is normally underfiled between the chip and the support circuit to reduce stress on the solder joints due to thermal mismatch between the chip and the support circuit, and the underfilling process increases both manufacturing complexity and cost. Furthermore, the solder joints exhibit increased electrical resistance as well as cracks and voids over time due to fatigue from thermo-mechanical stresses. Finally, the solder is typically a tin-lead alloy and lead-based materials are becoming far less popular due to environmental concerns over disposing of toxic materials and leaching of toxic materials into ground water supplies.

Other techniques besides wire bonding, TAB and flip-chip bonding have been developed to connect chips to external circuitry without using wires, leads or bumps. Such techniques include thin film rerouting at the wafer, panel or module level, and attaching a pre-patterned substrate to the chip such that through-holes in the substrate expose the pads and selectively applying conductive material into the through-holes. Several approaches are described below.

A typical thin film routing approach includes depositing a dielectric material on the chip, providing through-holes in the dielectric material that expose the pads, providing metallization in the through-holes that contacts the pads, and providing a top layer of conductive circuitry on the dielectric material that contacts the metallization. In this manner, the additional circuitry is fabricated on the chip. Drawbacks to this approach include complicated manufacturing requirements, high cost, and chip loss if the additional circuitry is defective. In particular, since the chip or wafer provides a substrate for the additional circuitry, chips will be lost if the additional circuitry fails to achieve certain quality and yield criteria. Unpredictable chip loss has prevented the wide spread adoption of this "chip first" approach in volume production. Furthermore, if the process is not performed on wafers, the commercially available silicon wafer processing equipment may not be compatible with common tooling and handling techniques.

U.S. Pat. No. 5,407,864 discloses providing a partially assembled printed circuit board (PCB) with buried conductive traces and through-holes that expose portions of the conductive traces, attaching the PCB to the chip using an adhesive, removing portions of the adhesive exposed by the through-holes to expose the pads, depositing a blanket conductive layer over the PCB which covers the pads and sidewalls of the through-holes without filling the through-holes, depositing a blanket insulative layer over the PCB which fills the remaining space in the through-holes, polishing the PCB to remove the conductive layer and the insulative layer from the top surface, and providing circuitry at the top surface that is connected to the conductive traces. In this manner, the circuitry at the top surface is connected to the pads through the conductive traces and portions of the conductive layer in the through-holes. Since, however, the conductive layer is blanket deposited over the entire PCB, polishing is used to remove the conductive layer from the top surface of the PCB since it would otherwise short the pads together. Polishing the conductive layer is costly and time consuming. Another drawback is that the polishing completely removes the top layer of the PCB, and therefore subsequent processes such as masking, circuitization and bumping are necessary for fabricating top surface circuitry such as traces and terminals for the next level assembly.

U.S. Pat. No. 6,037,665 discloses providing a chip with solder bumped pads, providing a pre-patterned multi-layer substrate with pre-metallized through-holes aligned with the pads, filling solder from the bumped pads into the through-holes, and reflowing the solder to form solder joint connections with the pads. This approach is similar to flip-chip bonding except that the solder is filled into the through-holes instead of merely being disposed between the chip and the substrate. Drawbacks to this approach include the need to solder bump the chip as well as the disadvantages of solder joints discussed above.

U.S. Pat. No. 5,116,463 discloses attaching a multi-layer substrate to a chip that includes forming through-holes through a dielectric layer that extend to the pads and electrolessly depositing metal into the through-holes. The electroless deposition is initiated by the pads and continues until the deposited metal fills the through-holes and contacts metallization on the top surface of the substrate. Drawbacks to this approach include the need for the metallization on the top surface to provide endpoint detection and the possibility that electroless deposition on the metallization on the top surface adjacent to the top of the through-hole may close the through-hole before the electroless deposition fills the through-hole. Furthermore, avoiding such premature closing of the through-hole imposes design constraints on the diameter of the through-hole and the thickness of the substrate which may be burdensome in some applications.

U.S. Pat. No. 5,556,810 discloses inner leads laminated by an organic film and attached to a chip by an adhesive. Distal ends of the inner leads are positioned near the pads and then electrically connected to the pads by L-shaped electroplated metal. However, since the inner leads are flexible and vary in height and length, the inner leads may not be positioned precisely and uniformly, the gaps between the distal ends and the respective pads can vary, and consequently the electroplated joints may be weak or open. Furthermore, if the chip has moderate to high pad density and a separate power/ground plane is needed to achieve better electrical performance, the single layer inner leads may not be suitable. In addition, handling of this leaded-chip for the next level assembly such as outer lead bonding or board level assembly can be problematic since the leads are soft and easily bent, rendering it difficult to maintain co-planarity among the leads during the next level assembly.

U.S. Pat. No. 5,665,652 addresses the gap variations between the inner leads and the pads by positioning the inner leads at designated locations before the electroplating starts. In this approach, columnar leads are inserted into guide holes of a guide tool on the surface of the chip, and each guide hole is aligned with one of the pads. The chip and guide tool are then soaked in an electrolytic solution during electroplating. Since the inner leads can be brought into reliable contact with the pads during electroplating, control of the electroplated connections is improved. However, a drawback of this approach is the difficult and time consuming nature of mechanically attaching and aligning the guide tool to chip as well as maintaining its precisely-aligned position throughout the electroplating process. The gap between the guide tool and the chip needs to be rigidly maintained. If the gap is too large, the guided inner leads may tilt and bend; if the gap is too small, insufficient electrolytic solution can lead to electrical field shielding and inadequate electroplating. Furthermore, since the guide tool is temporarily attached to the chip, it must be subsequently detached from the chip leaving the inner leads standing free. As a result, board level assembly of this leaded-chip can have high yield loss.

Recent introduction of grid array packaging (e.g., ball grid arrays), chip size packages (CSP) and flip-chip packages using high density interconnect substrates are relentlessly driving increased printed circuit board density. Shrinking traces and spaces and increasing layer count increase printed circuit board density, however reducing the size of plated through-holes can even more significantly increase Ad printed circuit board density. Small through-holes allow more routing space so that more conductive lines can be placed between the through-holes. Small through-holes also increase design flexibility and reduce design cycle time and overall product introduction time.

Conventional printed circuit boards have drilled through-holes with a size (diameter) in the range of 200 to 400 microns. As drilling technology improves, the drilled through-hole size is anticipated to reach 100 microns. Moreover, recently developed methods for forming through-holes using a punch, plasma or laser have driven down through-hole size to the range of 50 microns or less. A typical chip pad has a length and width on the order of 50 to 100 microns. Since the through-holes allow the pads to interconnect with various circuitry layers, using through-holes with similar sizes to the pads is desirable. The major advantage of using metallization in through-holes to interconnect the pads is that it replaces external media such as wires, bumps and leads.

The semiconductor chip assembly is subsequently connected to another circuit such as a PCB or mother board during next level assembly. Different semiconductor assemblies are connected to the next level assembly in different ways. For instance, ball grid array (BGA) packages contain an array of solder balls, and land grid array (LGA) packages contain an array of metal pads that receive corresponding solder traces on the PCB. However, since BGA and LGA packages are connected to the PCB by solder joints, the compliance is small and solder joint reliability problems exist. BGA and LGA packages have been designed with pillar post type contact terminals that extend above the package and act as a stand-off or spacer between the package and the PCB in order to absorb thermal stresses and reduce solder joint fatigue. Plastic quad flat pack (PQFP) packages have a lead frame formed into a gull-wing shape. When the PQFP is assembled on a PCB, this gull-wing lead serves as the contact terminal which provides compliance and reduces stress on the solder joints. However, drawbacks to PQFP packages include the large size of the lead and poor high frequency electrical characteristics.

In view of the various development stages and limitations in currently available semiconductor chip assemblies, there is a need for a semiconductor chip assembly that is cost-effective, reliable, manufacturable, provides excellent mechanical and electrical performance, and complies with stringent environmental standards.

SUMMARY OF THE INVENTION

An object of the present invention is to provide a semiconductor chip assembly with a chip and a support circuit that provides a low cost, high performance, high reliability package.

Another objective of the present invention is to provide a convenient, costeffective method for manufacturing semiconductor chip assemblies as chip scale packages, chip size packages, ball grid arrays or other structures.

In accordance with one aspect of the invention, a method of manufacturing a semiconductor chip assembly includes providing a semiconductor chip that includes a conductive pad, providing a support circuit that includes an insulative base and a conductive trace, mechanically attaching the chip to the support circuit such that the base covers a portion of the conductive trace and a portion of the pad is directly beneath the conductive trace, and then applying an etch to form an opening in the base that exposes the conductive trace and the pad.

In accordance with another aspect of the invention, a method of manufacturing a semiconductor chip assembly includes providing a semiconductor chip that includes a conductive pad, providing a support circuit that includes an insulative base and a conductive trace, providing an adhesive on a bottom of the conductive trace, then applying an etch to form an opening in the base that exposes the conductive trace, applying an etch to form an opening in the adhesive directly beneath the opening in the base, and then mechanically attaching the chip to the support circuit using the adhesive such that the opening in the base exposes the conductive trace and the openings expose the pad.

Preferably, the method includes forming a connection joint inside the openings that contacts and electrically connects the conductive trace and the pad.

It is also preferred that the conductive trace includes a pillar and a routing line, the pillar extends above the base and the routing line, and the routing line extends below the base.

An advantage of the present invention is that the semiconductor chip assembly need not include wire bonds, TAB leads or solder joints. Another advantage is that the assembly can be manufactured using low temperature processes which reduces stress and improves reliability. A further advantage is that the assembly can be manufactured using well-controlled wet chemical processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

FIGS. 1A–1E and 2A–2E are cross-sectional and top views, respectively, of a method of manufacturing a semiconductor chip assembly in accordance with a first embodiment of the present invention.

Figure 1A:
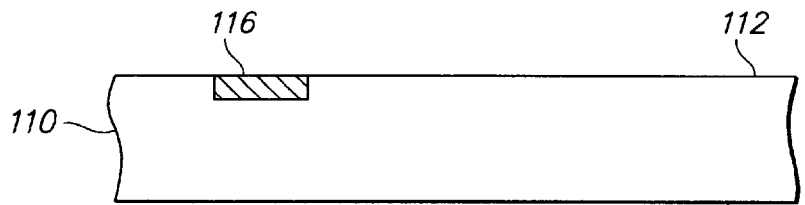
FIGS. 1A–1E are cross-sectional views showing a method of manufacturing a semiconductor chip assembly in accordance with a first embodiment of the present invention.
Figure 2A:
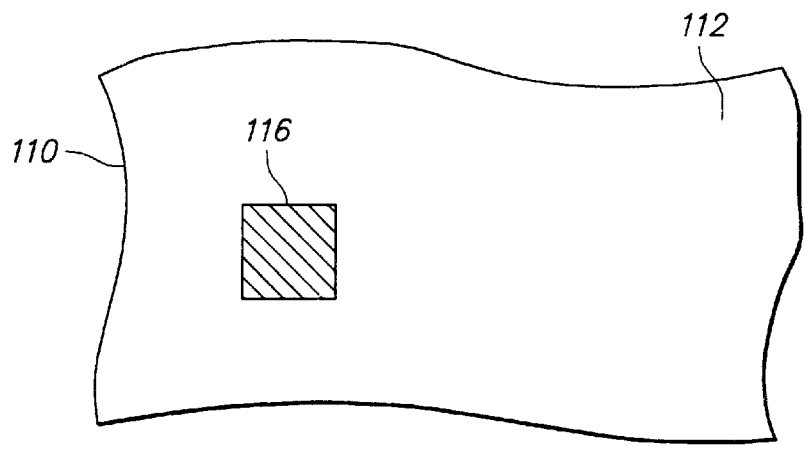
FIGS. 2A–2E are top plan views corresponding to FIGS. 1A–1E, respectively.

FIGS. 1A and 2A are cross-sectional and top views, respectively, of semiconductor chip 110 in which various transistors, circuits, interconnect lines and the like are formed (not shown). Chip 110 includes upper surface 112 and lower surface 114. Upper surface 112 includes conductive pad 116. Pad 116 is substantially aligned with the insulative housing of chip 110 so that upper surface 112 is essentially flat. Afternatively, if desired, pad 116 can extend above or be recessed below the insulative housing. Pad 116 provides a bonding site to electrically couple chip 110 with external circuitry. Thus, pad 116 can be an input/output pad or a power/ground pad. Pad 116 can have an aluminum base that serves as a surface layer, or alternatively, an aluminum base covered by a surface layer such as gold with an adhesion and/or barrier layer therebetween, depending on the nature of a connection joint that shall subsequently contact the pad. If desired, the aluminum base of pad 116 is cleaned by dipping chip 110 in an alkaline solution containing 0.05 M phosphoric acid at room temperature for 1 minute and then rinsed in distilled water before depositing the next layer on the aluminum base. Pad 116 has a length and width of the same size in the range of 20 to 100 microns. Chip 110 includes many other pads on upper surface 112, and only pad 116 is shown for convenience of illustration.

Figure 1B:
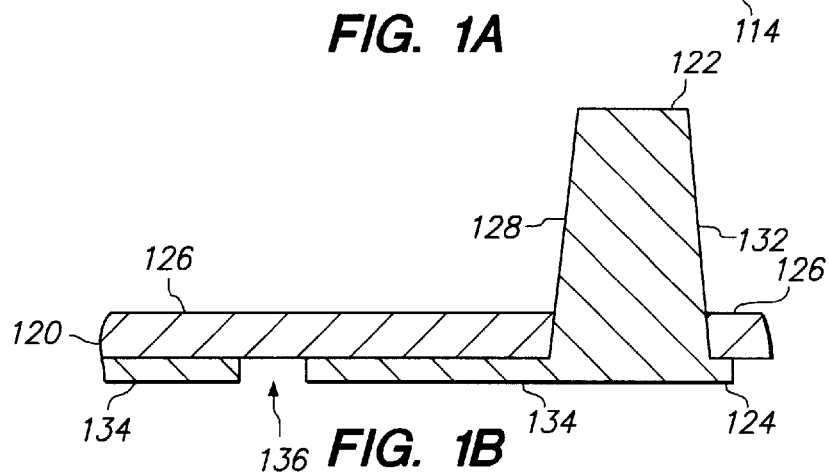
Figure 2B:
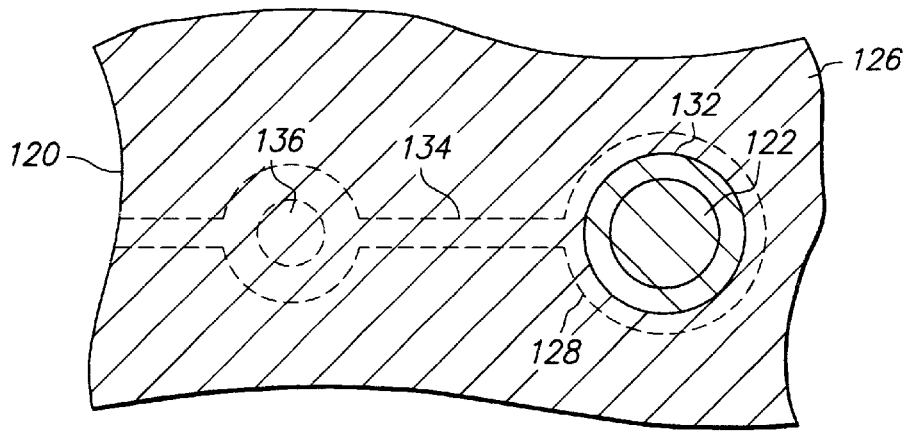

FIGS. 1B and 2B are cross-sectional and top views, respectively, of support circuit 120 which is adapted to be mechanically and electrically coupled to chip 110 to form a semiconductor chip assembly. Support circuit 120 includes top surface 122 and bottom surface 124. Support circuit 120 also includes insulative base 126 and conductive trace 128. Conductive trace 128 is embedded in base 126 and may function as a signal, power or ground layer depending on the purpose of pad 116. Conductive trace 128 includes pillar 132 and routing line 134. Pillar 132 extends above base 126. Pillar 132 also tapers inwardly with increasing height. That is, pillar 132 has a diameter that decreases with increasing height and is narrowest at its top surface. The taper provides increased mechanical strength near the top surface of base 126 which is desirable during next level assembly. Pillar 132 also has a flat top surface which facilitates next level assembly. Routing line 134 extends below base 126 and forms part of bottom surface 124. Routing line 134 includes through-hole 136. Thus, through-hole 136 extends through routing line 134 and is covered by base 126. Through-hole 136 is horizontally offset from pillar 132, and routing line 134 provides horizontal routing (fan-in or fan-out) between through-hole 136 and pillar 132.

Preferably, base 126 is composed of an epoxy compound that includes an epoxy resin, a curing agent, an accelerator and a silica filler and has a thickness of 25 to 50 microns, conductive trace 128 is composed of copper, pillar 132 has a diameter of 300 to 500 microns that decreases with increasing height, a height of 150 to 300 microns and extends 100 to 250 microns above base 126, routing line 134 has a width of 10 to 100 microns and a thickness of 10 to 40 microns, and through-hole 136 has a diameter of 50 to 100 microns. Of course, other materials and dimensions are suitable.

Support circuit 120 includes other conductive traces in base 126, and only conductive trace 128 is shown for convenience of illustration. The other conductive traces each include a pillar, a routing line, and a through-hole that extends through the corresponding routing line and is covered by the base. In addition, the conductive traces are electrically isolated from one another by base 126 except for a plating bus and related circuitry that shall be subsequently disconnected or severed.

Support circuit 120 can be manufactured in a variety of ways. A preferred approach is described in U.S. application Ser. No. 09/643,213 filed Aug. 22, 2000 by Charles W. C. Lin entitled "Method of Making a Support Circuit for a Semiconductor Chip Assembly" which is incorporated by reference.

Figure 1C:
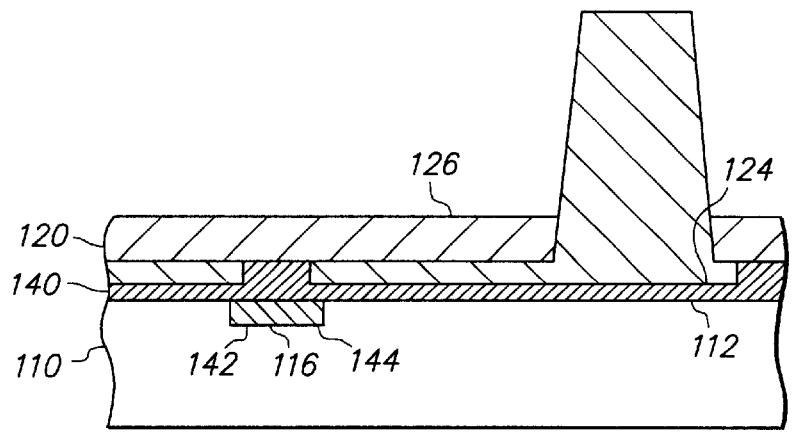
Figure 2C:
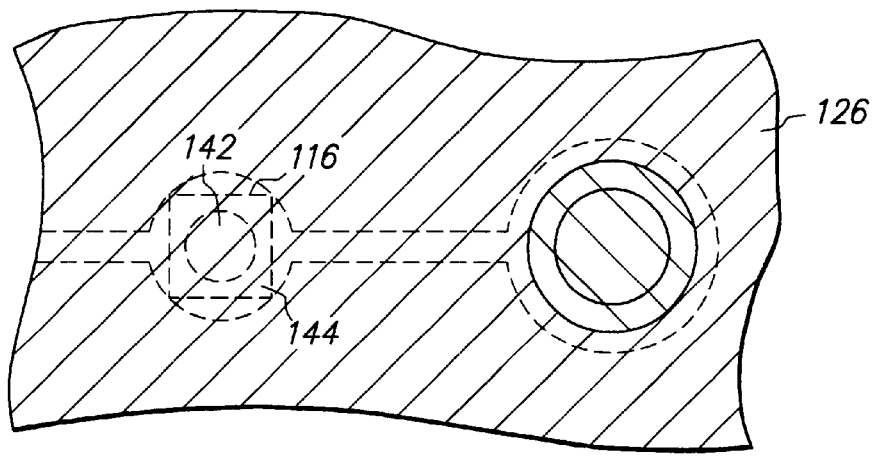

FIGS. 1C and 2C are cross-sectional and top views, respectively, of chip 110 mechanically attached to support circuit 120 by adhesive 140. Adhesive 140 is an electrical insulator disposed between and contacting upper surface 112 of chip 110 and bottom surface 124 of support circuit 120. Thus, chip 110 and support circuit 120 do not contact one another. Adhesive 140 is first applied to bottom surface 124, and then the combination of support circuit 120 and adhesive 140 is applied to upper surface 112. Alternatively, adhesive 140 can be applied to upper surface 112 and then attached to bottom surface 124. Adhesive 140 is applied as an adhesive paste such as Ablestik ABELBOND 961-2™. Preferably, adhesive 140 is sandwiched between upper surface 112 and bottom surface 124 using relatively low pressure while adhesive 140 is a paste. This causes adhesive 140 to contact the bottom surface of base 126 and other regions of support circuit 120 beneath base 126 as well as fill through-hole 136. In addition, chip 110 and support circuit 120 are positioned relative to one another so that pad 116 is aligned with through-hole 136. That is, at least a portion of pad 116, and preferably a majority of pad 116, is directly beneath through-hole 136. Since the length and width of pad 116 slightly exceed the diameter of through-hole 136, all of pad 116 cannot be directly beneath through-hole 36. Instead, central portion 142 of pad 116 is directly beneath through-hole 136 and peripheral portion 144 of pad 116 is outside through-hole 136. Pad 116 and through-hole 136 can be aligned using an automated pattern recognition system. Thereafter, adhesive 140 is cured or hardened at relatively low temperature in the range of 100–300° C. to form a solid adhesive layer that is 1 to 40 microns thick and mechanically fastens chip 110 to support circuit 120. At this stage, through-hole 136 is covered from above by base 126 and covered from below by adhesive 140, and adhesive 140 covers pad 116. Likewise, pad 116 is not electrically connected to conductive trace 128, which is separated from pad 116 by the thickness of adhesive 140.

Figure 1D:
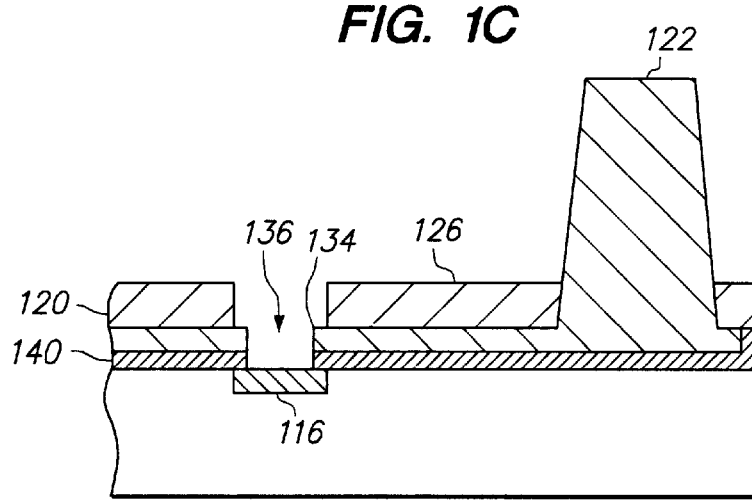
Figure 2D:
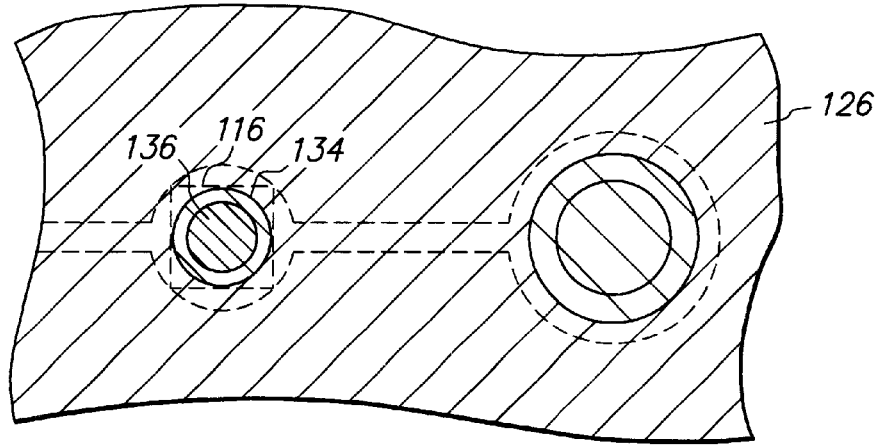

FIGS. 1D and 2D are cross-sectional and top views, respectively, of the partially completed assembly after openings are formed in base 126 and adhesive 140 so that pad 116 is exposed. In particular, a portion of base 126 above through-hole 136 is selectively removed to form an opening that exposes through-hole 136, the portion of adhesive 140 in through-hole 136 is removed, and a portion of adhesive 140 below through-hole 136 is selectively removed to form an opening that exposes pad 116 through the opening in base 126, through-hole 136, and the opening in adhesive 140. That is, at least a portion of pad 116, and preferably most of pad 116, is now exposed. This can be achieved by applying a suitable etch that is highly selective of base 126 and adhesive 140 with respect to pad 116 and routing line 134. The preferred etch depends on the relative thickness of base 126 and adhesive 140. Most etches exhibit little or no selectivity of base 126 with respect to adhesive 140. That is, base 126 and adhesive 140 etch at about the same rate.

The preferred etch is a selective laser etch. In particular, a metal mask (not shown) is positioned above top surface 122 such that an opening in the metal mask is aligned with through-hole 136, and a laser is directed to the side of the metal mask opposite support circuit 120. Accordingly, the metal mask targets the laser at through-hole 136. The laser forms an opening in base 126 directly above through-hole 136, thereby exposing through-hole 136. The laser also removes whatever adhesive 140 is inside through-hole 136. The laser also forms an opening in adhesive 140 directly below through-hole 136. In addition, the laser removes a small portion of base 126 outside through-hole 136 due to registration and alignment inaccuracies, thereby exposing a small portion of routing line 134 that was previously covered by base 126. The laser does not deform or remove an appreciable amount of pad 116 or routing line 134. In fact, pad 116 and routing line 134 are the only portions of chip 110 and support circuit 120 that provide an etch stop for the laser. As a result, the laser essentially provides an extension or pattern transfer of through-hole 136 through base 126 and adhesive 140. Although the opening in base 126 has a slightly larger diameter than that of through-hole 136, the opening in adhesive 140 has an essentially identical diameter to that of through-hole 136. Moreover, the opening in base 126, through-hole 136 and the opening in adhesive 140 are aligned with one another, have substantially similar diameters, and together expose pad 116.

Figure 1E:
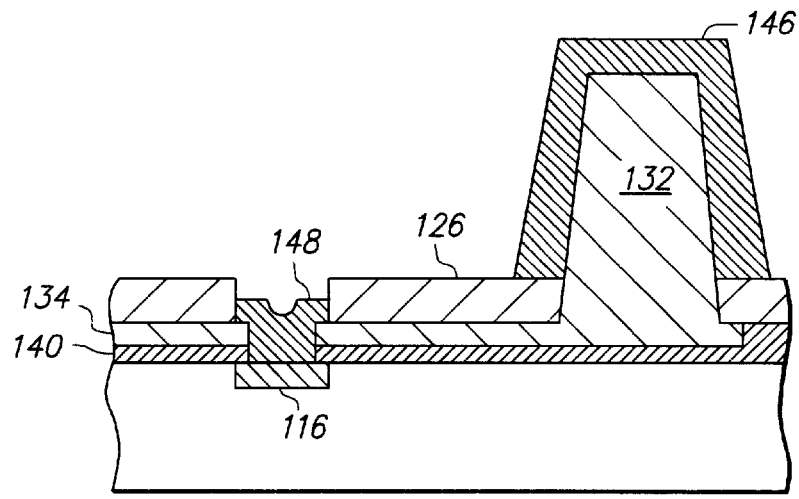
Figure 2E:
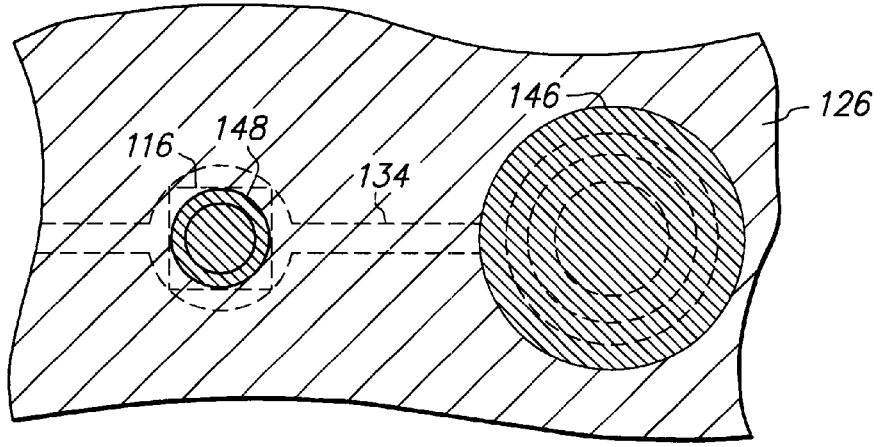

FIGS. 1E and 2E are cross-sectional and top views, respectively, of the completed assembly after contact terminal 146 and connection joint 148 are formed. As is seen, contact terminal 146 is formed on pillar 132, and connection joint 148 is formed in through-hole 136, extends through the opening in adhesive 140, and contacts routing line 134 and pad 116, thereby electrically connecting routing line 134 and pad 116. For illustration purposes, contact terminal 146 and connection joint 148 are formed simultaneously during an electroplating operation. Connection joint 148 initially electroplates inside through-hole 136 on routing line 134 (which is connected to a plating bus) but not on pad 116 (which is not connected to the plating bus). However, as the electroplating operation continues, connection joint 148 extends through the opening in adhesive 140, contacts pad 116, and then electroplates on both routing line 134 and pad 116. After the electroplating operation, connection joint 148 has a bowl-shape and does not fill or extend to the top of the opening in base 126. Thus, the opening in base 126 has a top sidewall portion that remains exposed and devoid of metal. In addition, connection joint 148 is the only electrical conductor in through-hole 136. After the assembly is removed from the electrolytic bath it is rinsed in distilled water to remove contaminants.

FIGS. 3A–3E, 4A–4E and 5A–5E are cross-sectional, top and cross-sectional views, respectively, of a method of manufacturing a semiconductor chip assembly in accordance with a second embodiment of the present invention. FIGS. 5A–5E are oriented orthogonally with respect to FIGS. 3A–3E and depict FIGS. 3A–3E as viewed from left-to-right. In the second embodiment, the routing line does not include a through-hole or a ring-shaped region that surrounds the through-hole. Instead, the routing line has a uniform width. The chip and the support circuit are mechanically attached using the adhesive and positioned relative to one another so that the routing line is disposed above and overlaps the pad, an etch is applied that forms openings in the base and the adhesive such that the opening in the base exposes the routing line and the openings expose the pad, and then the connection joint is formed in the openings and on the routing line and the pad. For purposes of brevity, any description in the first embodiment is incorporated herein insofar as the same is applicable, and the same description need not be repeated. Ukewise, elements of the second embodiment similar to those in the first embodiment have corresponding reference numerals indexed at two-hundred rather than one-hundred. For instance, chip 210 corresponds to chip 110, support circuit 220 corresponds to support circuit 120, etc.

Figure 3A:
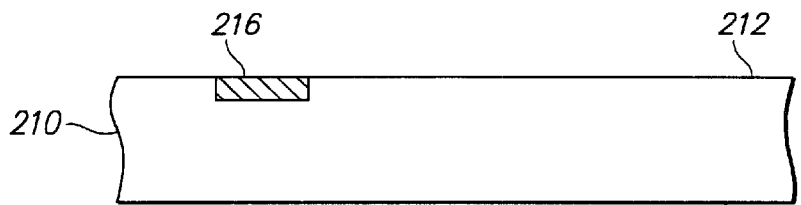
FIGS. 3A–3E are cross-sectional views showing a method of manufacturing a semiconductor chip assembly in accordance with a second embodiment of the present invention.
Figure 4A:
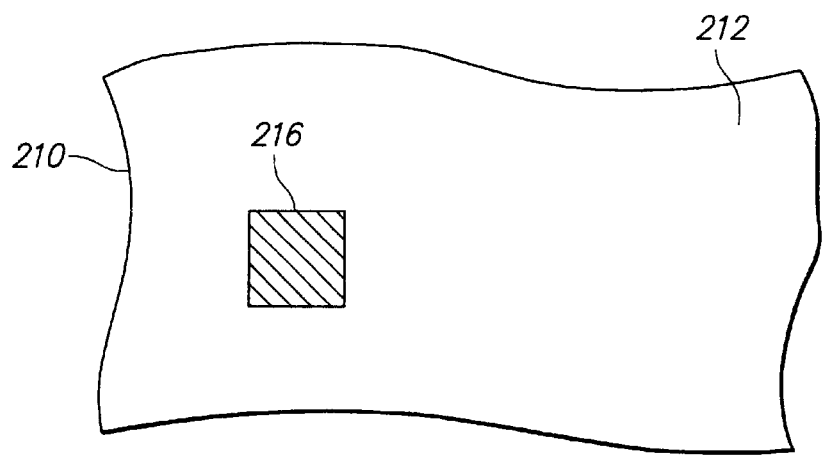
FIGS. 4A–4E are top plan views corresponding to FIGS. 3A–3E, respectively.
Figure 5A:
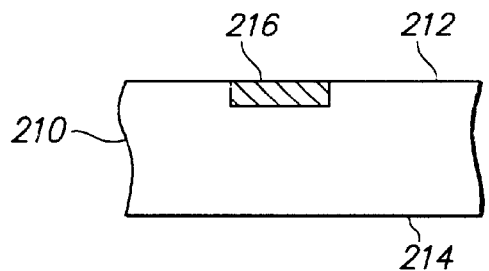
FIGS. 5A–5E are cross-sectional views corresponding to FIGS. 3A–3E, respectively.

FIGS. 3A, 4A and 5A are cross-sectional, top and cross-sectional views, respectively, of semiconductor chip 210 that includes upper surface 212, lower surface 214 and pad 216.

Figure 3B:
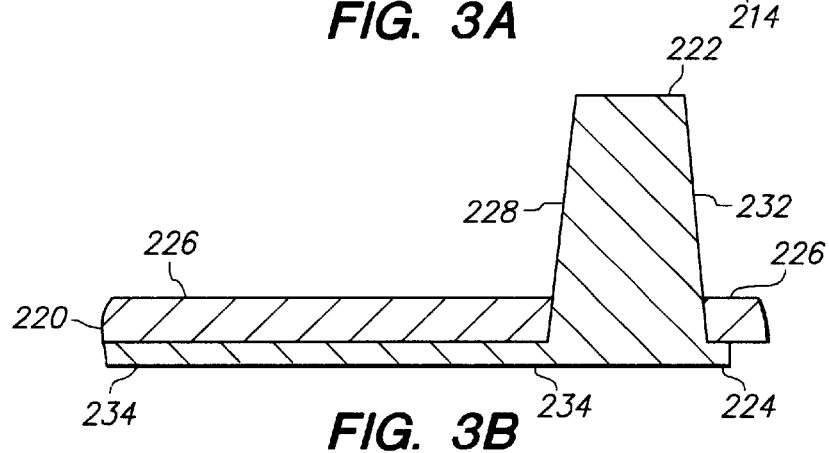
Figure 4B:
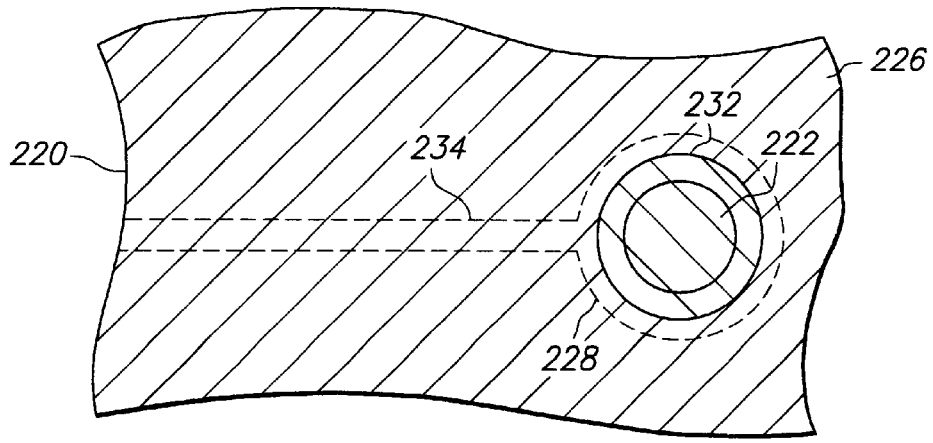
Figure 5B:
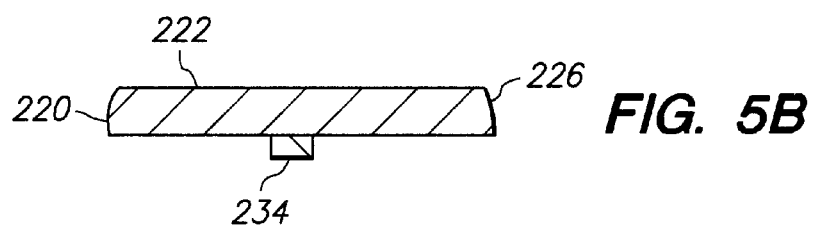

FIGS. 3B, 4B and 5B are cross-sectional, top and cross-sectional views, respectively, of support circuit 220 that includes top surface 222, bottom surface 224, insulative base 226 and conductive trace 228 which includes pillar 232 and routing line 234.

Figure 3C:
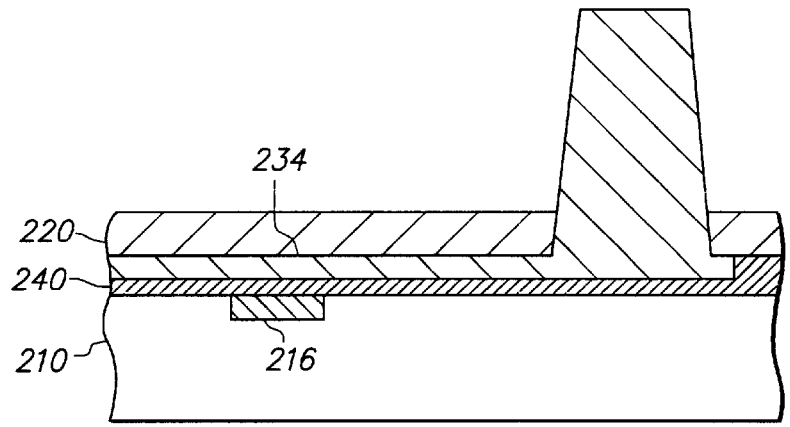
Figure 4C:
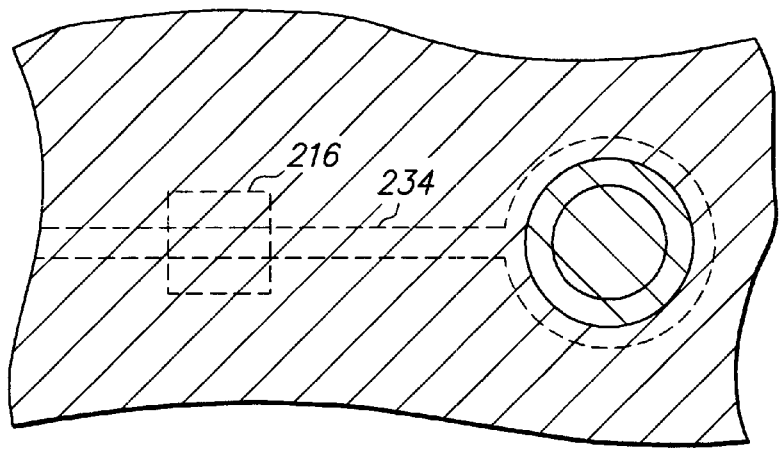
Figure 5C:
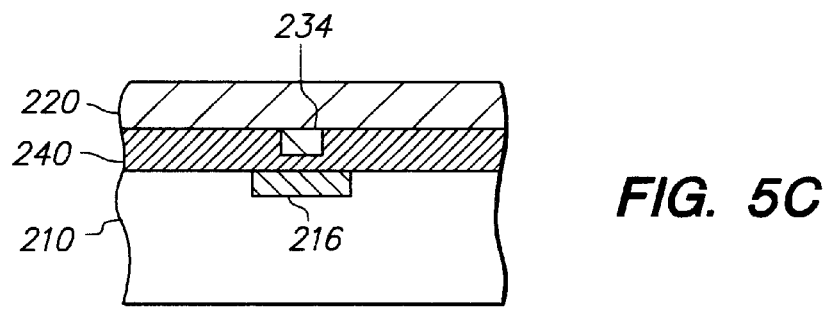

FIGS. 3C, 4C and 5C are cross-sectional, top and cross-sectional views, respectively, of chip 210 mechanically attached to support circuit 220 by adhesive 240. Routing line 234 is disposed above and overlaps and is electrically isolated from pad 216.

Figure 3D:
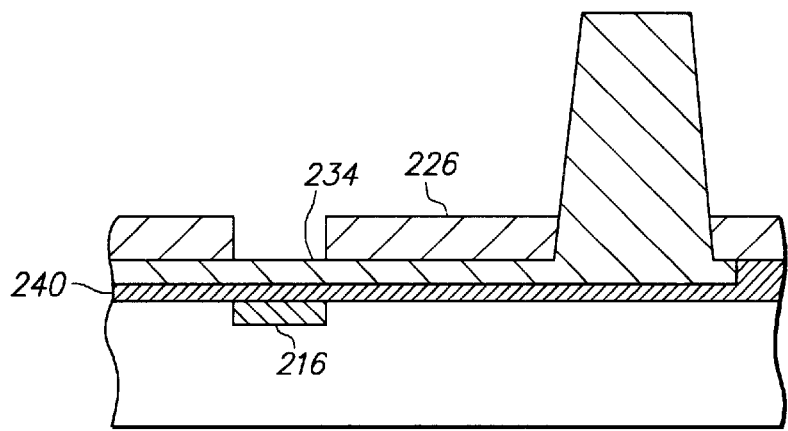
Figure 4D:
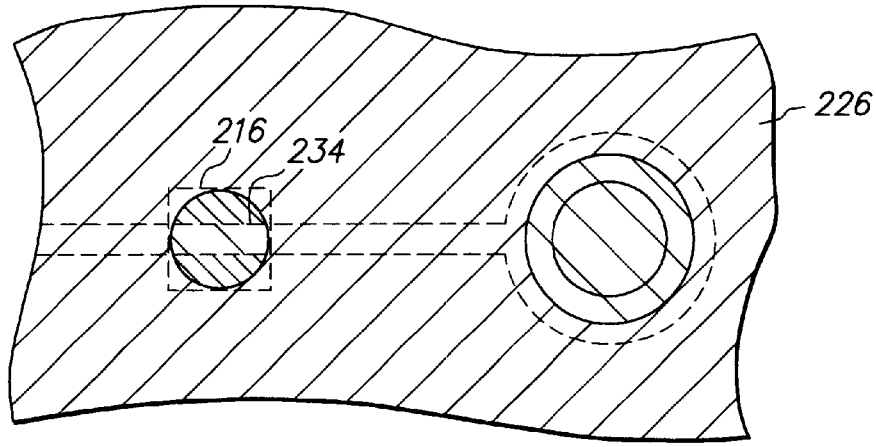
Figure 5D:
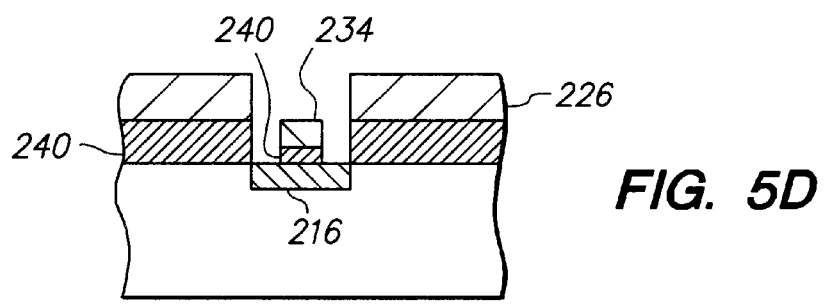

FIGS. 3D, 4D and 5D are cross-sectional, top and cross-sectional views, respectively, of the partially completed assembly after portions of base 226 and adhesive 240 are selectively removed to expose pad 216 and routing line 234. This can be achieved by applying a suitable etch that is highly selective of base 226 and adhesive 240 with respect to pad 216 and routing line 234. In this instance, a selective laser etch uses a metal mask to target the laser at pad 216. The laser etch removes a portion of base 226 above pad 216 and removes a portion of adhesive 240 above pad 216 and outside routing line 234. That is, routing line 234 shields the underlying adhesive 240 from the laser etch. As a result, openings are formed in base 226 and adhesive 240 without damaging pad 216 or routing line 234. The opening in base 226 exposes routing line 234, and the combination of openings in base 226 and adhesive 240 expose pad 216.

Figure 3E:
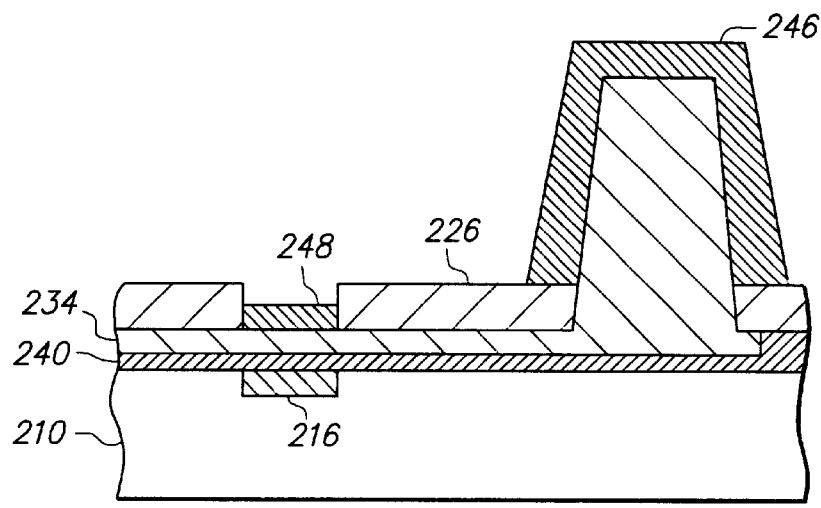
Figure 4E:
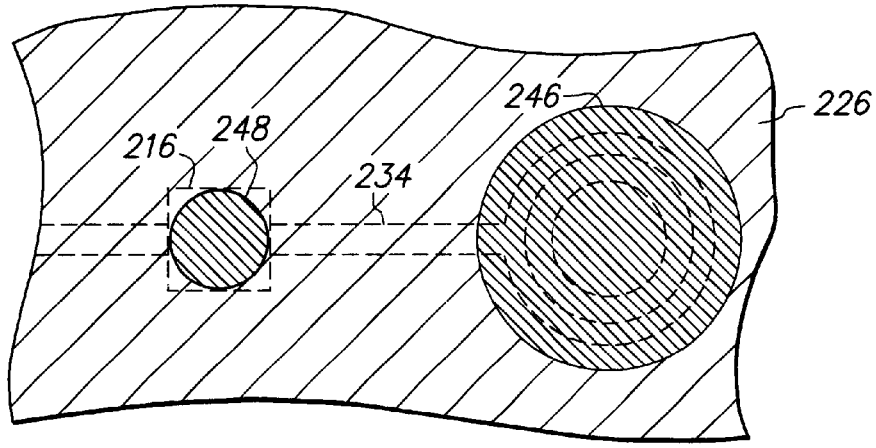
Figure 5E:
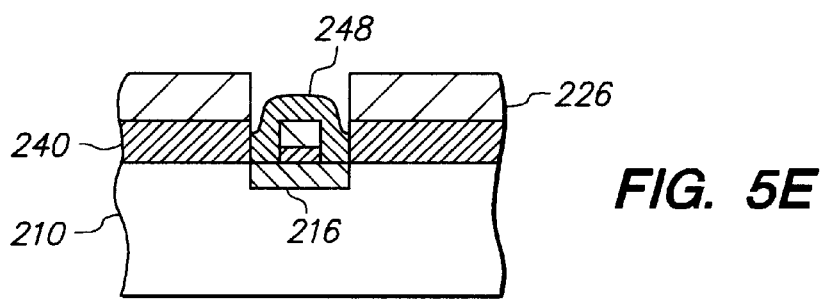

FIGS. 3E, 4E and 5E are cross-sectional, top and cross-sectional views, respectively, of the completed assembly after contact terminal 246 and connection joint 248 are formed. Contact terminal 246 provides a bumped bonding site for the next level assembly, and connection joint 248 provides a robust, permanent electrical connection between routing line 234 and pad 216. Connection joint 248 has an inverted U-like shape inside the openings in base 226 and adhesive 240 that completely covers the portions of routing line 234 and adhesive 240 beneath the opening in base 226 and covers portions of pad 216 beneath the opening in base 226 and outside routing line 234. Connection joint 248 is the only electrical conductor external to chip 210 that contacts pad 216, routing line 234 and connection joint 248 are the only electrical conductors in the opening in base 226, and adhesive 240 and connection joint 248 are the only materials that contact both pad 216 and routing line 234.

The semiconductor chip assemblies described above are merely exemplary. Numerous other embodiments are contemplated. For instance, various aspects of the first and second embodiments can be combined with one another.

The support circuit can be single or multi-layer printed circuit board, a lead frame, a tape, a glass panel, or a ceramic hybrid.

Figure 6:
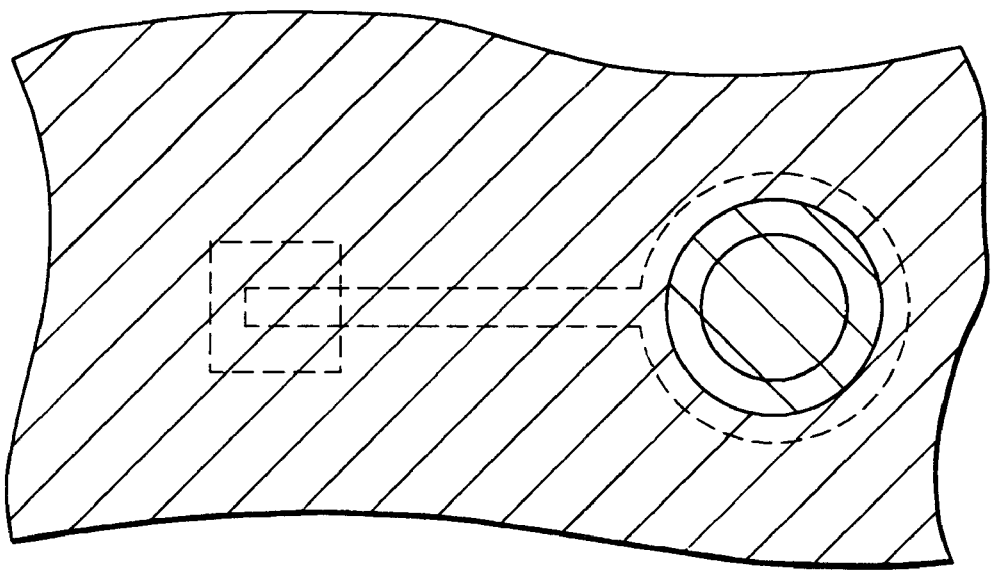
FIGS. 6–9 are top plan views of routing line variations in the second embodiment of the present invention.
Figure 7:
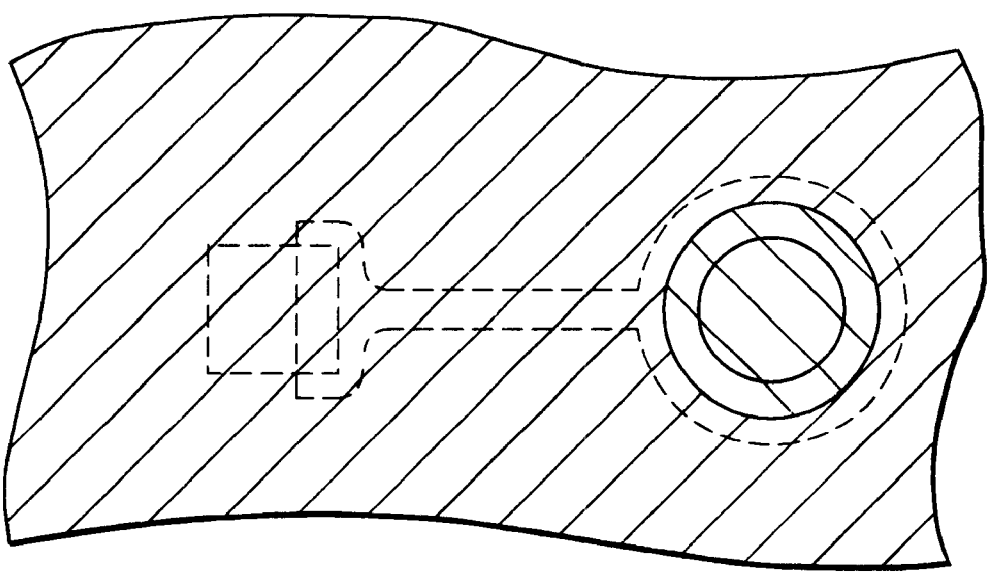
Figure 8:
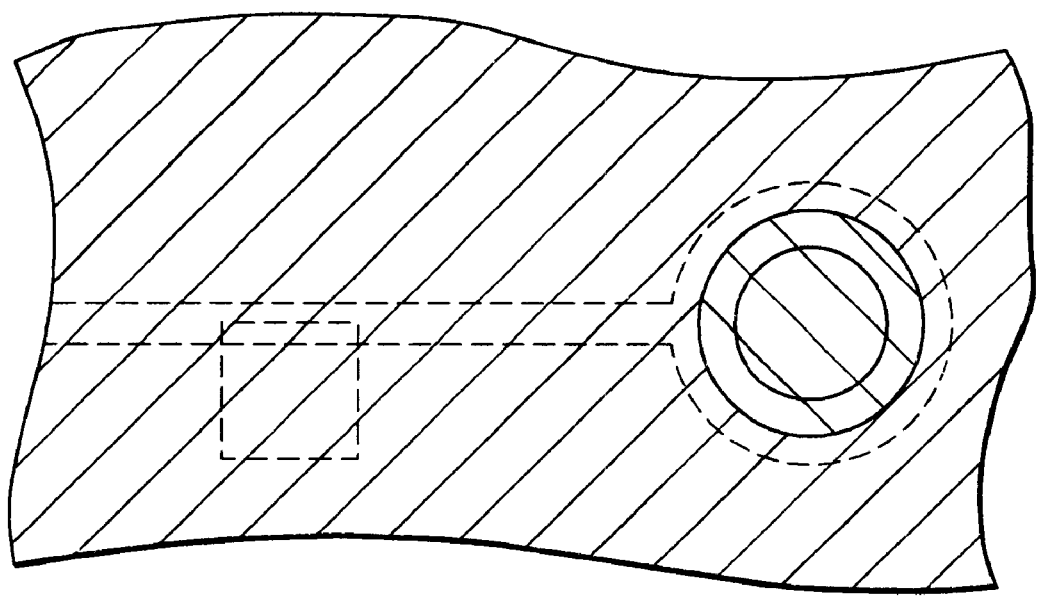
Figure 9:
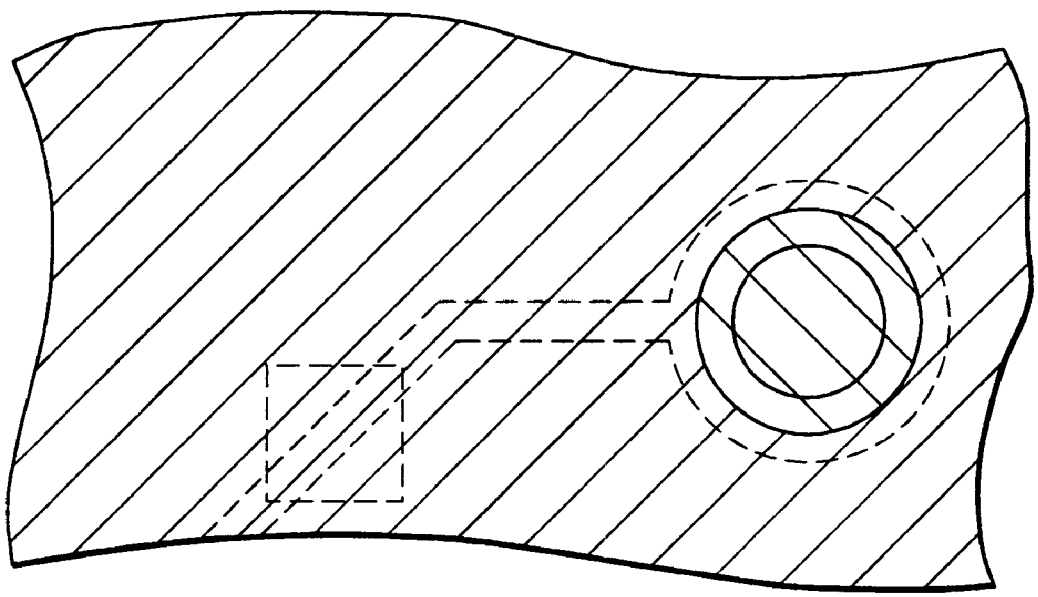

The conductive trace can have various shapes and sizes. The conductive trace can overlap various portions of the pad, such as four peripheral edges but not the center of the pad (FIG. 2C), two opposing peripheral edges and the center of the pad (FIG. 4C), one peripheral edge and the center of the pad (FIG. 6), three peripheral edges but not the center of the pad (FIGS. 7 and 8), or two corners and the center of the pad (FIG. 9).

The conductive trace can be various conductive metals including copper, gold, nickel, aluminum, tin, combinations thereof, and alloys thereof. Of common metallic materials, copper has especially low resistivity and cost. Furthermore, those skilled in the art will understand that in the context of a support circuit, a copper conductive trace is typically a copper alloy that is mostly copper but not pure elemental copper, such copper-zirconium (99.9% copper), copper-silver-phosphorus-magnesium (99.7% copper), or copper-tin-iron-phosphorus (99.7% copper). The conductive trace may function as a signal, power or ground layer depending on the purpose the associated chip pad. The conductive trace need not necessarily extend above the top surface of the base or below the bottom surface of the base. Furthermore, the top portion of the conductive trace can be a ball, a pad, or a pillar (columnar post). A pillar is particularly well-suited for reducing thermal mismatch related stress in the next level assembly.

The pad can have numerous shapes including a flat rectangular shape and a bumped shape. For instance, a bump-shaped pad may extend into the through-hole and openings and may even extend above the routing line. The pad can either be partially or completely exposed forming the connection joint. The pad can have a length and width that are larger than, equal to, or smaller than the diameter of the through-hole and openings. Preferably, the pad, through-hole and openings have the same or similar size, and essentially all of the pad is directly beneath the through-hole and openings.

The pillar, through-hole and openings can have a circular, ovular, square, rectangular or other shape (as viewed from the top surface of the support circuit). The through-hole and openings may be aligned with and expose a single pad or a plurality of pads. Furthermore, the pillar, through-hole and openings can have sidewalls with a wide variety of shapes and slopes including vertical sidewalls, tapered sidewalls, continuous sidewalls and stepped sidewalls.

The insulative base may be rigid or flexible, and may be formed from numerous organic or inorganic insulators such as tape (polyimide), epoxy, silicone, glass (aramid) and ceramic. Organic insulators are preferred for low cost, high dielectric applications, whereas inorganic insulators are preferred when high thermal dissipation and a matched thermal coefficient of expansion are important.

Numerous adhesives can be used between the chip and the support circuit. For instance, the adhesive can be applied as a paste, a laminated layer, or a liquid applied by screen-printing, spin-on, or spray-on. If a laminated adhesive is applied, little or no adhesive will enter the through-hole or contact the base.

The opening in the base that exposes the through-hole or routing line may be formed either before or after mechanically attaching the support circuit to the chip. Likewise, the opening in the adhesive beneath the opening in the base may be formed either before or after mechanically attaching the support circuit to the chip. For instance, the adhesive can be applied as a paste (A stage) to the bottom surface of the support circuit, the adhesive can be partially cured (B stage), an etch can form the openings in the base and the adhesive, the partially cured adhesive can be brought into contact with the chip, thereby exposing the pad through the openings and the through-hole, and then the adhesive can be fully cured (C stage).

As an example of forming the openings in the base and the adhesive before mechanically attaching the support circuit to the chip, adhesive 140 is applied as a paste to bottom surface 124 of support circuit 120 without contacting chip 110, then adhesive 140 is partially cured at 120° C., then the laser is applied to form the openings in base 126 and adhesive 140 and remove whatever adhesive 140 that resides in through-hole 136, then chip 110 and support circuit 120 are positioned relative to one another so that pad 116 and through-hole 136 are aligned with one another, then adhesive 140 is brought in low pressure contact with upper surface 112 of chip 110 such that adhesive 140 is sandwiched between upper surface 112 of chip 110 and bottom surface 124 of support circuit 120 and the openings in base 126 and adhesive 140 and through-hole 136 expose pad 116, and then adhesive 140 is fully cured at 300° C. to form a solid adhesive layer that mechanically fastens chip 110 to support circuit 120.

As another example of forming the openings in the base and the adhesive before mechanically attaching the support circuit to the chip, adhesive 240 is applied as a paste to bottom surface 224 of support circuit 220 without contacting chip 210, then adhesive 240 is partially cured at 120° C., then the laser is applied to form the openings in base 226 and adhesive 240 (i.e., remove whatever adhesive 240 that resides beneath the opening in base 226 and outside routing line 234) such that the opening in base 226 exposes routing line 234, then chip 210 and support circuit 220 are positioned relative to one another so that pad 216 and the opening in base 226 are aligned with one another, then adhesive 240 is brought in low pressure contact with upper surface 212 of chip 210 such that adhesive 240 is sandwiched between upper surface 212 of chip 210 and bottom surface 224 of support circuit 220 and the openings in base 226 and adhesive 240 expose pad 216, and then adhesive 240 is fully cured at 300° C. to form a solid adhesive layer that mechanically fastens chip 210 to support circuit 220.

The connection joint can be formed from a wide variety of materials including copper, gold, nickel, palladium, tin, alloys thereof, and combinations thereof, can be formed by a wide variety of processes including electroplating, electroless plating, and solder reflow, and can have a wide variety of shapes as sizes. The choice between a connection joint that partially or completely fills the through-hole and/or openings and the shape of the connection joint depends on design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip assembly with Ball Bond Connection Joint" which is incorporated by reference.

After the connection joint is formed, further encapsulation can be performed but is generally not necessary. In particular, it is not necessary to fill a conductor or insulator into whatever space remains in the through-hole or the opening in the base, or to deposit an insulator over the base. However, in the event the base is thin, it may be desirable to provide an encapsulant to enhance the mechanical strength of the support circuit.

After the connection joint is formed, a soldering material or solder ball can be deposited over the pillar by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

After the connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, then prior to singulation a photolithography step can be added to selectively cut related circuitry on the assembly that is dedicated to the plating bus since this circuitry would otherwise short the conductive traces together.

The "upper" and "lower" surfaces of the chip and the "top" and "bottom" surfaces of the support circuit do not depend on the orientation of the assembly, as will be readily apparent to those skilled in the art. For instance, the upper surface of the chip includes the pad and faces the bottom surface of the support circuit, and the top surface of the support circuit faces away from the chip, regardless of whether the assembly is inverted and/or mounted on a printed circuit board. Similarly, the support circuit is disposed "above" the chip when the bottom surface of the support circuit faces the upper surface of the chip regardless of whether the assembly is inverted. Likewise, the support circuit is shown with the pillar above the routing line and the support circuit is shown above the chip with a single orientation throughout the drawings for ease of comparison between the figures, although the support circuit and the assembly may be inverted at various manufacturing stages.

The working format can be a single chip, a wafer, a strip or a panel based on he manufacturing design. For instance, when the working format is a wafer, numerous semiconductor chip assemblies can be simultaneously batch manufactured on a single wafer and then separated from one another into chip scale packages during singulation. As another example, when the working format is a strip (or reel-to-reel) form of the support circuit, the wafer is singulated into individual chips, the chips are individually attached to support circuits on the strip, the semiconductor chip assemblies are formed by exposing the pads and forming the connection joints, and then the assemblies are separated from one another by cutting the strip. Assemblies manufactured using a strip can be chip scale packages, chip size packages, ball grid arrays, or other structures. The wafer-based approach employs fewer steps and is less time consuming than the strip-based approach, however the strip-based approach is easier to control and has better dimensional stability than the wafer-based approach since aligning the routing lines with the pads involves a single chip and a single support circuit rather than the entire wafer and numerous support circuits.

Advantageously, the present invention provides a semiconductor chip assembly that is reliable and inexpensive. A single etch step can form openings both above and below the routing line. The mode of the connection shifts from the initial mechanical coupling to metallurgical coupling to assure sufficient metallurgical bond strength. The connection joint can be confined to the vicinity near the pad and related openings in the base and adhesive without extending over the base. The pillar yields enhanced reliability for the next level assembly that exceeds that of conventional BGA packages. Furthermore, mechanical and metallurgical coupling between the chip and the support circuit can be provided without wire bonding, TAB, flip-chip bonding, polishing, photolithography, or solder joints. As a result, the assembly of the present invention significantly enhances throughput, yield and performance characteristics compared to conventional packaging techniques. Moreover, the assembly of the present invention is well-suited for use with materials compatible with copper chip and lead-tree environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A method of manufacturing a semiconductor chip assembly, comprising:
   providing a semiconductor chip that includes a conductive pad;
   providing a support circuit that includes an insulative base and a conductive trace;
   mechanically attaching the chip to the support circuit such that the base covers a portion of the conductive trace and a portion of the pad is directly beneath the conductive trace; and then
   applying an etch to form an opening in the base that exposes the conductive trace and the pad.

2. The method of claim 1, wherein applying the etch includes directing a laser at the base.

3. The method of claim 1, wherein the conductive trace includes a pillar and a routing line, the pillar extends above the base and is horizontally spaced from the pad, and the routing line extends below the base and extends above and overlaps the pad.

4. The method of claim 1, wherein the conductive trace overlaps only one peripheral edge of the pad.

5. The method of claim 1, wherein the conductive trace overlaps only two peripheral edges of the pad, and the two peripheral edges are opposite one another.

6. The method of claim 1, wherein mechanically attaching the chip to the support circuit includes disposing an insulative adhesive between the chip and the support circuit, and applying the etch forms an opening in the adhesive directly beneath the opening in the base, thereby exposing the conductive trace through the opening in the base and exposing the pad through the openings in the base and the adhesive.

7. The method of claim 1, including forming a connection joint in the opening that contacts and electrically connects the conductive trace and the pad.

8. The method of claim 7, wherein the connection joint contacts a surface of the conductive trace that is disposed above and overlaps and faces away from the pad.

9. The method of claim 8, wherein the surface of the conductive trace is disposed above a center of the pad.

10. The method of claim 1, wherein the assembly is a chip scale package.

11. A method of manufacturing a semiconductor chip assembly, comprising:
    providing a semiconductor chip that includes a conductive pad;
    providing a support circuit that includes an insulative base and a conductive trace within the base, wherein the conductive trace includes pillar and a routing line, the pillar extends above the base and the routing line, and the base covers the routing line; then
    disposing an adhesive between the chip and the support circuit, thereby mechanically attaching the chip to the support circuit, such that the routing line is disposed above and overlaps the pad, and the adhesive covers the pad; then
    forming an opening in the base, thereby exposing the routing line;
    forming an opening in the adhesive, thereby exposing the pad through the openings; and then
    forming a connection joint in the openings that contacts and electrically connects the routing line and the pad.

12. The method of claim 11, including applying a single etch that forms the openings.

13. The method of claim 12, wherein the etch is provided by a laser.

14. The method of claim 11, wherein the routing line extends below the base.

15. The method of claim 11, wherein the routing line overlaps only one peripheral edge of the pad.

16. The method of claim 11 wherein the routing line overlaps only two peripheral edges of the pad, and the two peripheral edges are opposite one another.

17. The method of claim 11, wherein the connection joint contacts a surface of the routing line that is disposed above and overlaps and faces away from the pad.

18. The method of claim 11, wherein the connection joint is the only electrical conductor external to the chip that contacts the pad.

19. The method of claim 11, wherein the connection joint and the adhesive are the only materials external to the chip that contact the pad.

20. The method of claim 11, wherein the connection joint and the adhesive are the only materials that contact both the conductive trace and the pad.

21. The method of claim 11, wherein an upper portion of the opening in the base remains exposed and devoid of metal after forming the connection joint.

22. The method of claim 11, wherein the openings expose the routing line and the pad without exposing any other conductive traces above the chip and without exposing any other pads on the chip.

23. The method of claim 11, wherein disposing the adhesive includes applying a paste and curing the paste.

24. The method of claim 11, wherein the pillar is formed subtractively.

25. The method of claim 11, wherein the pillar has a flat top surface and a diameter that is narrowest at its top surface.

26. The method of claim 11, wherein the pillar extends a first distance above the routing line, the base extends a second distance above the routing line, and the first distance is at least twice the second distance.

27. The method of claim 11, wherein the pillar extends at least 100 microns above the base.

28. The method of claim 11, wherein the conductive trace is copper and the insulative base is epoxy.

29. The method of claim 11, wherein the assembly is devoid of wire bonds, TAB leads and solder joints.

30. The method of claim 11, wherein the assembly is a chip scale package.

31. A method of manufacturing a semiconductor chip assembly, comprising the following steps in the sequence set forth:
    disposing an insulative adhesive between a chip and a support circuit, thereby mechanically attaching the chip to the support circuit, wherein the chip includes a pad, the support circuit includes an insulative base and a conductive trace, the conductive trace includes a pillar and a routing line, the pillar extends above the base and the routing line, the base is adjacent to and covers a top of the routing line, the adhesive is adjacent to and covers a bottom of the routing line, the adhesive is adjacent to and covers the pad, and the routing line is disposed above and overlaps and is electrically isolated from the pad;
    applying an etch that forms an opening in the base and an opening in the adhesive, thereby exposing the routing line through the opening in the base and the pad through the openings in the base and the adhesive; and forming a connection joint inside the openings that contacts and electrically connects the routing line and the pad.

32. The method of claim 31, wherein the routing line provides horizontal routing between the pillar and the pad, and the pillar and the connection joint provide vertical routing between a top surface of the support circuit and the pad.

33. The method of claim 31, wherein the routing line extends below the base.

34. The method of claim 31, wherein the routing line overlaps only one peripheral edge of the pad.

35. The method of claim 31 wherein the routing line overlaps only two peripheral edges of the pad, and the two peripheral edges are opposite one another.

36. The method of claim 31, wherein the adhesive contacts the routing line and the base.

37. The method of claim 31, wherein the etch is provided by a laser.

38. The method of claim 31, wherein the connection joint contacts a surface of the routing line that is disposed above and overlaps and faces away from the pad.

39. The method of claim 31, wherein the connection joint is the only electrical conductor external to the chip that contacts the pad.

40. The method of claim 31, wherein the connection joint includes electroplated metal.

41. The method of claim 31, wherein the connection joint includes electrolessly plated metal.

42. The method of claim 31, wherein the connection joint and the adhesive are the only materials external to the chip that contact the pad.

43. The method of claim 31, wherein the connection joint and the adhesive are the only materials that contact both the conductive trace and the pad.

44. The method of claim 31, wherein a top sidewall portion of the opening in the base remains exposed and devoid of metal after forming the connection joint.

45. The method of claim 31, wherein a top sidewall portion of the opening in the base is covered by the connection joint.

46. The method of claim 31, wherein the openings expose the routing line and the pad without exposing any other conductive traces above the chip and without exposing any other pads on the chip.

47. The method of claim 31, wherein the pillar is formed subtractively.

48. The method of claim 31, wherein the pillar has a diameter that is narrowest at its top surface.

49. The method of claim 31, wherein the pillar has a continuous taper between its top surface and the base.

50. The method of claim 31, wherein the pillar has a continuous taper between its top surface and the routing line.

51. The method of claim 31, wherein the pillar has a flat top surface.

52. The method of claim 31, wherein the pillar extends a first distance above the routing line, the base extends a second distance above the routing line, and the first distance is at least twice the second distance.

53. The method of claim 31, wherein the pillar extends at least 100 microns above the base.

54. The method of claim 31, wherein the conductive trace is a metal selected from the group consisting of copper, gold, nickel, palladium, tin, combinations thereof, and alloys thereof.

55. The method of claim 31, wherein the base is an insulator selected from the group consisting of tape, epoxy, silicone, glass and ceramic.

56. The method of claim 31, wherein the conductive trace is copper and the base is epoxy.

57. The method of claim 31, wherein the method excludes polishing.

58. The method of claim 31, wherein the assembly is devoid of wire bonds and TAB leads.

59. The method of claim 31, wherein the assembly is devoid of wire bonds, TAB leads and solder joints.

60. The method of claim 31, wherein the assembly is a chip scale package.

61. A method of manufacturing a semiconductor chip assembly, comprising:

providing a semiconductor chip that includes a conductive pad;

providing a support circuit that includes an insulative base and a conductive trace;

providing an adhesive on a bottom of the conductive trace; then applying an etch to form an opening in the base that exposes the conductive trace;

applying an etch to form an opening in the adhesive directly beneath the opening in the base; and then mechanically attaching the chip to the support circuit using the adhesive such that the opening in the base exposes the conductive trace and the openings expose the pad.

62. The method of claim 61, wherein applying the etch to form the opening in the base and applying the etch to form the opening in the adhesive are performed by applying a single laser etch.

63. The method of claim 61, wherein the conductive trace includes a pillar and a routing line, the pillar extends above the base and is horizontally spaced from the pad, and the routing line extends below the base and extends above and overlaps the pad.

64. The method of claim 61, wherein the conductive trace overlaps only one peripheral edge of the pad.

65. The method of claim 61, wherein the conductive trace overlaps only two peripheral edges of the pad, and the two peripheral edges are opposite one another.

66. The method of claim 61, wherein the adhesive contacts the conductive trace and the base.

67. The method of claim 61, including forming a connection joint in the openings that contacts and electrically connects the conductive trace and the pad.

68. The method of claim 67, wherein the connection joint contacts a surface of the conductive trace that is disposed above and overlaps and faces away from the pad.

69. The method of claim 68, wherein the surface of the conductive trace is disposed above a center of the pad.

70. The method of claim 61, wherein the assembly is a chip scale package.

71. A method of manufacturing a semiconductor chip assembly, comprising:

providing a semiconductor chip that includes a conductive pad;

providing a support circuit that includes an insulative base and a conductive trace within the base, wherein the conductive trace includes pillar and a routing line, the pillar extends above the base and the routing line, and the base covers a top of the routing line;

providing an adhesive on a bottom of the routing line; then forming an opening in the base, thereby exposing the routing line;

forming an opening in the adhesive directly beneath the opening in the base; then mechanically attaching the chip to the support circuit using the adhesive such that the routing line is disposed above and overlaps the pad, the opening in the base exposes the routing line and the openings expose the pad; and then forming a connection joint in the openings that contacts and electrically connects the routing line and the pad.

72. The method of claim 71, including applying a single etch that forms the openings.

73. The method of claim 72, wherein the etch is provided by a laser.

74. The method of claim 71, wherein the routing line extends below the base.

75. The method of claim 71, wherein the routing line overlaps only one peripheral edge of the pad.

76. The method of claim 71 wherein the routing line overlaps only two peripheral edges of the pad, and the two peripheral edges are opposite one another.

77. The method of claim 71, wherein the connection joint contacts a surface of the routing line that is disposed above and overlaps and faces away from the pad.

78. The method of claim 71, wherein the connection joint is the only electrical conductor external to the chip that contacts the pad.

79. The method of claim 71, wherein the connection joint and the adhesive are the only materials external to the chip that contact the pad.

80. The method of claim 71, wherein the connection joint and the adhesive are the only materials that contact both the conductive trace and the pad.

81. The method of claim 71, wherein an upper portion of the opening in the base remains exposed and devoid of metal after forming the connection joint.

82. The method of claim 71, wherein the openings expose the routing line and the pad without exposing any other conductive traces above the chip and without exposing any other pads on the chip.

83. The method of claim 71, wherein providing the adhesive includes partially curing the adhesive, and mechanically attaching the chip to the support circuit includes fully curing the adhesive.

84. The method of claim 71, wherein the pillar is formed subtractively.

85. The method of claim 71, wherein the pillar has a flat top surface and a diameter that is narrowest at its top surface.

86. The method of claim 71, wherein the pillar extends a first distance above the routing line, the base extends a second distance above the routing line, and the first distance is at least twice the second distance.

87. The method of claim 71, wherein the pillar extends at least 100 microns above the base.

88. The method of claim 71, wherein the conductive trace is copper and the insulative base is epoxy.

89. The method of claim 71, wherein the assembly is devoid of wire bonds, TAB leads and solder joints.

90. The method of claim 71, wherein the assembly is a chip scale package.

91. A method of manufacturing a semiconductor chip assembly, comprising the following steps in the sequence set forth:

providing a support circuit that includes an insulative base and a conductive trace, wherein the conductive trace includes a pillar and a routing line, the pillar extends above the base and the routing line, and the base is adjacent to and covers a top of the routing line;

providing an insulative adhesive on a bottom surface of the support circuit, wherein the adhesive is adjacent to and covers a bottom of the routing line;

applying an etch that forms an opening in the base and an opening in the adhesive, wherein the opening in the base exposes the top of the routing line and the opening in the adhesive is directly beneath the opening in the base;

mechanically attaching a chip to the support circuit using the adhesive, wherein the chip includes a pad, the routing line is disposed above and overlaps and is electrically isolated from the pad, the opening in the base exposes the routing line and the openings expose the pad; and forming a connection joint inside the openings that contacts and electrically connects the routing line and the pad.

92. The method of claim 91, wherein the routing line provides horizontal routing between the pillar and the pad, and the pillar and the connection joint provide vertical routing between a top surface of the support circuit and the pad.

93. The method of claim 91, wherein the routing line extends below the base.

94. The method of claim 91, wherein the routing line overlaps only one peripheral edge of the pad.

95. The method of claim 91 wherein the routing line overlaps only two peripheral edges of the pad, and the two peripheral edges are opposite one another.

96. The method of claim 91, wherein the adhesive contacts the routing line and the base.

97. The method of claim 91, wherein the etch is provided by a laser.

98. The method of claim 91, wherein the connection joint contacts a surface of the routing line that is disposed above and overlaps and faces away from the pad.

99. The method of claim 91, wherein the connection joint is the only electrical conductor external to the chip that contacts the pad.

100. The method of claim 91, wherein the connection joint includes electroplated metal.

101. The method of claim 91, wherein the connection joint includes electrolessly plated metal.

102. The method of claim 91, wherein the connection joint and the adhesive are the only materials external to the chip that contact the pad.

103. The method of claim 91, wherein the connection joint and the adhesive are the only materials that contact both the conductive trace and the pad.

104. The method of claim 91, wherein a top sidewall portion of the opening in the base remains exposed and devoid of metal after forming the connection joint.

105. The method of claim 91, wherein a top sidewall portion of the opening in the base is covered by the connection joint.

106. The method of claim 91, wherein the openings expose the routing line and the pad without exposing any other conductive traces above the chip and without exposing any other pads on the chip.

107. The method of claim 91, wherein the pillar is formed subtractively.

108. The method of claim 91, wherein the pillar has a diameter that is narrowest at its top surface.

109. The method of claim 91, wherein the pillar has a continuous taper between its top surface and the base.

110. The method of claim 91, wherein the pillar has a continuous taper between its top surface and the routing line.

111. The method of claim 91, wherein the pillar has a flat top surface.

112. The method of claim 91, wherein the pillar extends a first distance above the routing line, the base extends a second distance above the routing line, and the first distance is at least twice the second distance.

113. The method of claim 91, wherein the pillar extends at least 100 microns above the base.

114. The method of claim 91, wherein the conductive trace is a metal selected from the group consisting of copper, gold, nickel, palladium, tin, combinations thereof, and alloys thereof.

115. The method of claim 91, wherein the base is an insulator selected from the group consisting of tape, epoxy, silicone, glass and ceramic.

116. The method of claim 91, wherein the conductive trace is copper and the base is epoxy.

117. The method of claim 91, wherein the method excludes polishing.

118. The method of claim 91, wherein the assembly is devoid of wire bonds and TAB leads.

119. The method of claim 91, wherein the assembly is devoid of wire bonds, TAB leads and solder joints.

120. The method of claim 91, wherein the assembly is a chip scale package.

\* \* \* \* \*